United States Patent [19]
Chang

[11] Patent Number: 5,567,639
[45] Date of Patent: Oct. 22, 1996

[54] METHOD OF FORMING A STACK CAPACITOR OF FIN STRUCTURE FOR DRAM CELL

[75] Inventor: Su-Jaw Chang, Hsin-Chu, Taiwan

[73] Assignee: Utron Technology Inc., Hsin-Chu, Taiwan

[21] Appl. No.: 582,707

[22] Filed: Jan. 4, 1996

[51] Int. Cl.⁶ .......................... H01L 21/70; H01L 27/00
[52] U.S. Cl. .................. 437/52; 437/60; 437/919
[58] Field of Search .................. 437/47–48, 52, 437/60, 919; 257/306–310; 148/DIG. 14

[56] References Cited

U.S. PATENT DOCUMENTS

| | | | |
|---|---|---|---|
| 5,053,351 | 10/1991 | Fazan | 437/52 |
| 5,185,282 | 2/1993 | Lee et al. | 437/52 |
| 5,422,295 | 6/1995 | Choi et al. | 437/52 |

Primary Examiner—H. Jey Tsai
Attorney, Agent, or Firm—H. C. Lin

[57] ABSTRACT

The polysilicon bottom electrode of a stacked fin structure storage capacitor for a DRAM cell is self-aligned with the buried contact to the diffusion of a MOSFET. A silicon nitride layer and a sacrificial oxide (sac) umbrella overhangs the buried contact. Using the sac oxide as a mask, the silicon nitride layer is undercut until a part of the polysilicon buried contact is exposed. Then another polysilicon layer is deposited to contact the buried contact and to form the bottom electrode of the capacitor. Thus the bottom electrode and the buried contact are self-aligned. Again, using the sac oxide as a mask, the bottom electrode is etched laterally to form fin-shape electrode. Then, the bottom electrode is deposited with a capacitor dielectric and a top electrode to form the storage capacitor.

10 Claims, 6 Drawing Sheets

PRIOR ART

METHOD OF FORMING A STACK CAPACITOR OF FIN STRUCTURE FOR DRAM CELL

BACKGROUND OF THE INVENTION

This invention relates to a method of fabricating a storage capacitor for a DRAM memory cell, in particular a capacitor of stacked fin structure.

In a DRAM cell, it is desirable to reduce the size of a memory cell for increasing the memory capacity of an integrated circuit (IC). Yet, the storage capacitance of the cell should be made large to increase charge storage. The requirements for small size and large storage capacitance are inconsistent.

To overcome this problem, a stacked capacitor of fin structure has been disclosed in U.S. Pat. Nos. 5,290,726 and 5,128,273. By stacking a number of fins as the electrode of the storage capacitor, the effective area of the electrode, hence the capacitance per cell, is greatly increased.

In all the previous methods of fabrication, they all require more than three masking steps. It is desirable to reduce the number of masking steps in fabricating an IC to lower cost and increase yield.

SUMMARY

The object of this invention is to reduce the number of masking steps to fabricate a fin-type stacked capacitor for a DRAM. Another object of this invention is to reduce the capacitor area by self-alignment.

The object is achieved by using two masking steps for the Node technology which contains a polysilicon node contact to a diffusion of an MOSFET, a polysilicon bottom electrode of the storage capacitor, a dielectric and a polysilicon top electrode of the capacitor. During processing, a silicon nitride and sacrificial oxide (sac) oxide layer is patterned to form an umbrella over the node contact. Next, the silicon nitride is undercut below the sac oxide until the node contact is exposed. The bottom electrode polysilicon is then deposited to make self-aligned contact with the node contact. The bottom electrode polysilicon is etched back to form fins.

The features are:

(1) to utilize the masking capability of silicon-nitride against oxidation to create a self-aligned poly-silicon node contact;

(2) to etch back the poly-silicon with high selectivity with reference to oxide;

(3) to dip back SiN in phosphoric acid to make contact between a buried poly-Si contact and the bottom electrode of the capacitor.

DETAILED DESCRIPTION OF THE PREFERRED EMBODIMENT

Figure 1A:
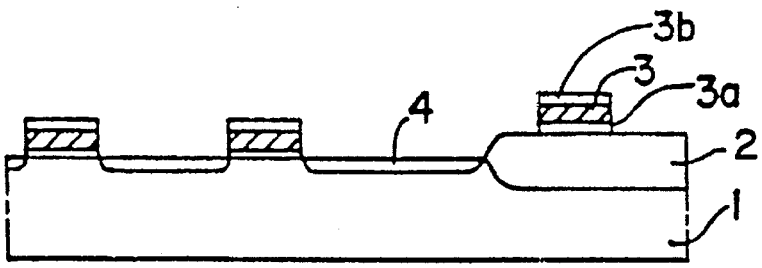
FIGS. 1a–1g show the processing steps of a prior art disclosed in U.S. Pat. No. 5,128,273.

Before describing the present invention, it is pertinent to review the shortcomings of the prior art.

In U.S. Pat. No. 5,128,273, the cross-sectional view of the storage capacitor of a DRAM cell is shown in FIG. 1g. An n-type source or drain is diffused in a p-type substrate 1. A transfer gate 3 lies over the channel region between the source and the drain through a gate oxide to constitute an MOSFET. Outside the active MOSFET region is the field oxide (FOX) 2. One of the n-type diffusions is connected to a bit line 14. The other n-type diffusion is connected to the bottom capacitor electrode 9,7 of poly-silicon. Except for the contact area to the bit line 14 and the contact area to the bottom electrode 9,7, the surface is covered with an insulating layer 5. The bottom electrode is shaped like a stacked fin to increase the surface area of the bottom capacitor, hence the capacitance. The upper electrode of the capacitor is of poly-silicon. The bottom electrode 9,7 and upper electrode 11 are separated by a thin dielectric layer and form the storage capacitor. By shaping the electrode in fin-shaped stack, the storage capacitance is increased by increasing the electrode area.

The stacked fin-type capacitor, according to U.S. Pat. Nos. 5,128,273 and 5,290,726, can be fabricated by two different processes. The former process is shown in FIGS. 1a–1g. The latter process is shown in FIG. 2a–2h.

As shown in FIG. 1a, field oxide layer 2 is first grown on silicon substrate 1 so that silicon 3substrate 1 is divided into active regions and field regions. Subsequently, the gate oxide layer 3a, polysilicon layer 3 and cap gate oxide layer 3b are formed in turn on the active and field regions. Cap gate oxide layer 3b, polysilicon layer 3 and cap gate oxide layer 3aare subjected to a photoetching process so as to form polysilicon gate structure (word lines) as shown in FIG. 1a. Silicon substrate 1 is then subjected to impurity ion injection to form source and drain regions 4, also as shown in FIG. 1a.

Figure 1B:
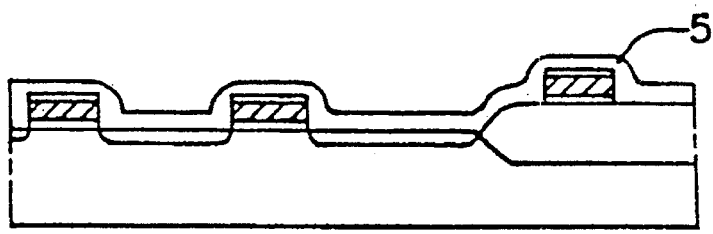

As shown in FIG. 1b, $Si_3N_4$ layer 5 is deposited over the surface of silicon substrate 1. As discussed below, $Si_3N_4$ layer 5 is used as an etch stop layer in a subsequent processing step.

Figure 1C:
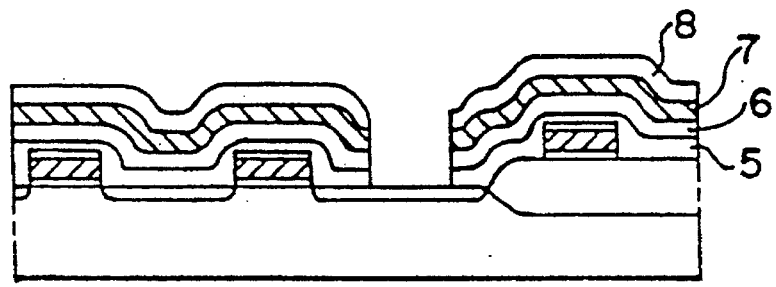

As shown in FIG. 1c, $SiO_2$ layer 6, polysilicon layer 7 for a first fin of the storage node and $SiO_2$ layer 8 are deposited in turn on $Si_3N_4$ layer 5. Thereafter, an opening for a storage node buried contact is formed by a dry etching process.

Figure 1D:
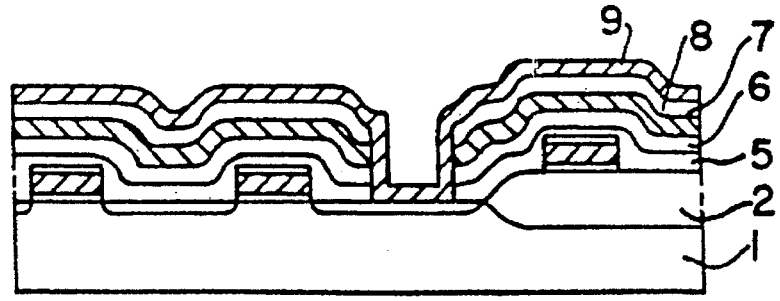

As shown in FIG. 1d, polysilicon layer 9 is deposited on the overall exposed surface. Polysilicon layer 9 is formed as to contact the remaining portions of polysilicon layer 7 and also region 4 to form a buried contact as shown in FIG. 1d.

Figure 1E:
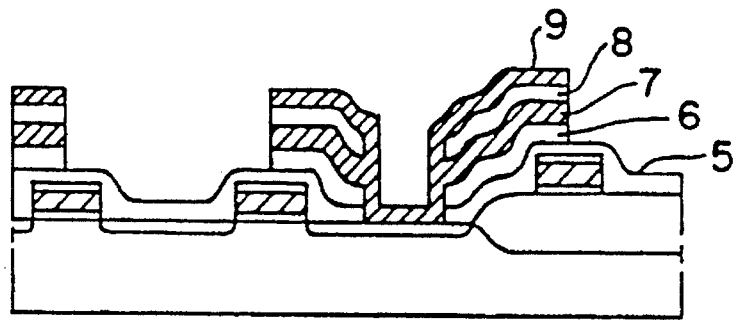

As shown in FIG. 1e, storage nodes are then defined by using a mask having a predetermined pattern. That is, polysilicon layers 7 and 9 (for the storage node) and $SiO_2$ layers 6 and 8 are etched by a dry etching process with $Si_3N_4$ layer 5 serving as an etch stop layer.

Figure 1F:
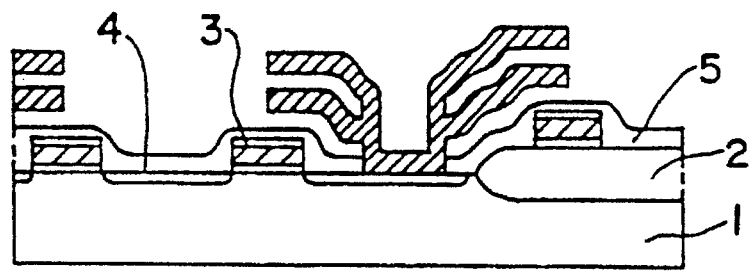
Figure 1G:
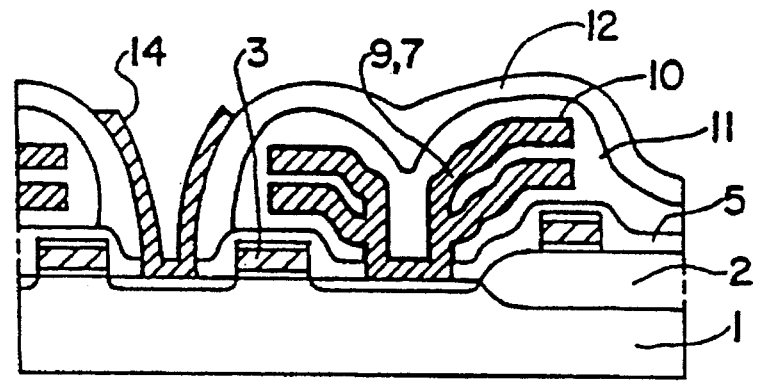

As shown in FIG. 1f, remaining $SiO_2$ layers 6 and 8 between polysilicon layers 7 and 9 for the storage node and Si3N4 layer 5 are completely removed by a wet etching process. Subsequently, dielectric layer 10 (denoted by a thick line in FIG. 1g) is formed on the overall exposed surface of the storage node defined by the remaining portions of polysilicon layers 7 and 9 (denoted 9,7 in FIG. 1g).

As shown in FIG. 1g, polysilicon layer 11 for a plate node is deposited over the overall exposed surface. Polysilicon layer 11 sequentially is defined by mask and etching process, and SiO2 layer layer 12 and $Si_3N_4$ layer 5 are then etched by a dry etching process so as to form bit line contact holes. Thereafter, metal is deposited on the overall exposed surface, and the deposited metal layer is subsequently defined by mask and dry etching processes to form bit line 14. Thus, a DRAM cell having stacked capacitors of fin structures is obtained.

It can be seen that the process from FIG. 1a to FIG. 1g requires four masking steps as shown in FIGS. 1a, 1c, 1e and 1g, or three masking steps after source/drain diffusion.

In another process disclosed in U.S. Pat. No. 5,290,726, the steps are are shown in FIGS. 2a–2h.

Figure 2A:
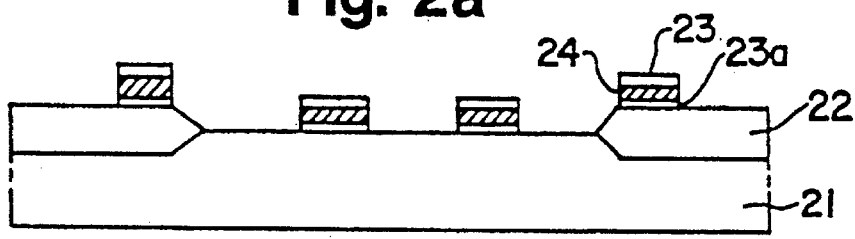
FIGS. 2a–2h show the processing steps of another prior art disclosed in U.S. Pat. No. 5,290,726.

As shown in FIG. 2a, field oxide layer 22 is first grown on p-type silicon substrate 21 so that silicon substrate 21 is divided into active regions and field regions, which as shown are formed by what is known as a local oxidation of silicon process, Then, gate oxide layer 23a is grown in the active and field regions, on which is deposited polysilicon layer 24 and on which is formed in turn cap gate oxide layer 23. Cap gate oxide layer 23, polysilicon layer 24 and gate oxide layer 23a are subjected to photoetching processes so as to form gate structures (word lines) as shown in FIG. 2a.

Figure 2B:
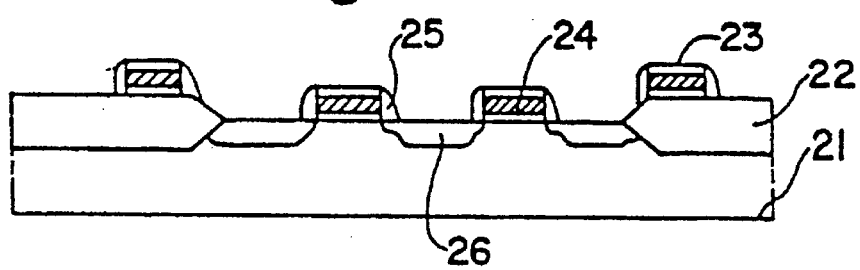

As shown in. FIG. 2b, silicon substrate 21 is then subjected to an injection of n-type impurities as a first step to form source and drain regions 26 thereon. On remaining portions of polysilicon layer 24, side wall exide layer 25 is formed. Thereafter, silicon substrate 21 is subjected to an injection of n+ type impurities to form source and drains 26 having what is known as an LDD or lightly doped drain structure.

Figure 2C:
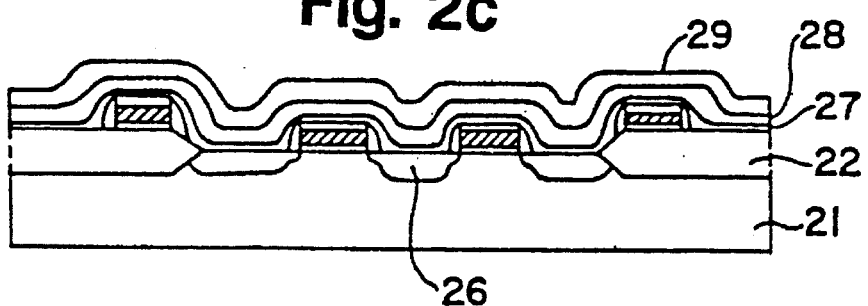

As shown in FIG. 2c, over the overall exposed surface first oxide layer 27 having high etch selectivity nitride layer 28 and second oxide layer 29 are deposited in turn. First oxide layer 27 is of a sufficient thickness to provide a suitable liminate for nitride layer 28, while second oxide layer 29 is of a suitable thickness thicker than that of first oxide layer 27, and sufficient for use in forming polysilicon storage nodes as more fully described below. On the other hand, nitride layer 28 has a proper thickness so as to provide an increase in the area of the capacitor regions, also as more fully described below.

Figure 2D:
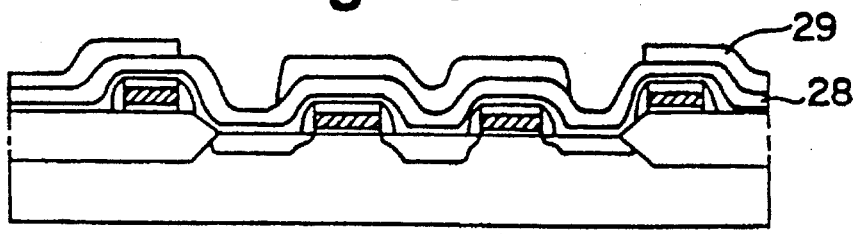
Figure 2E:
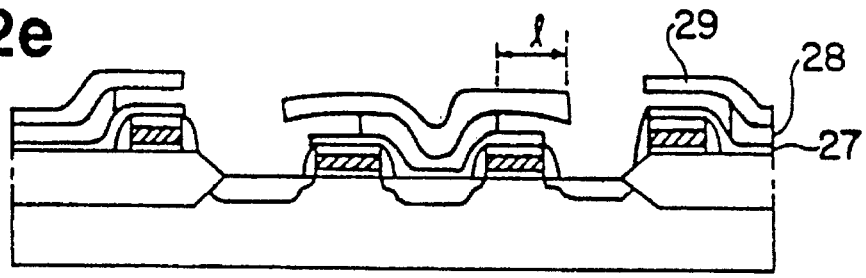

As shown in FIG. 2d, thereafter second oxide layer 29 is defined by a dry etching process so that its portions at buried contact regions are removed to expose partially nitride layer 28 In effect, second oxide layer 29 is defined so as to provide a storage node contact mask. As shown in FIG. 2e, the exposed portions of nitride layer 28 at the buried contact regions are then etched by a wet process. The wet etching of nitride layer 28 (to form storage node contact hole with certain of regions 26) is conducted so as to result in portions of nitride layer 28 disposed beneath second oxide layer 29 also to be etched. The etch length of each hidden portion of nitride layer 28 is a predetermined length 1 as indicated in FIG. 2e, and etched length 1 can be controlled by the time of the wet etch processing.

Figure 2F:
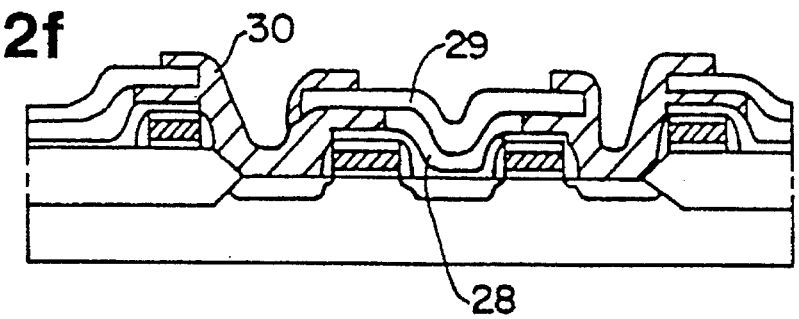
Figure 2G:
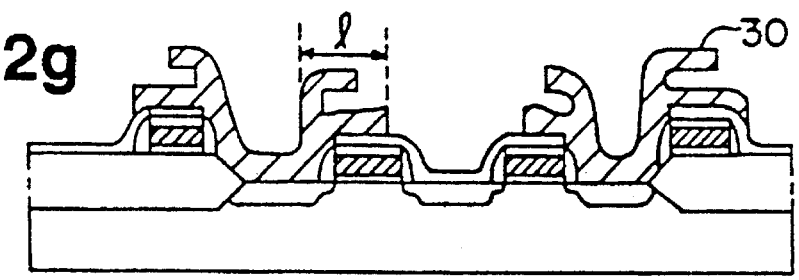

As illustrated in FIG. 2f, portions of oxide layer 27 at the buried contact regions are removed by a wet etching process, and a polysilicon layer is deposited over the overall exposed surface and then removed partially at its unnecessary regions to form polysilicon storage nodes 30. As shown in FIG. 2g, the remaining portions of second oxide layer 29 and nitride layer 28 thereafter are completely removed by wet etching processes.

Figure 2H:
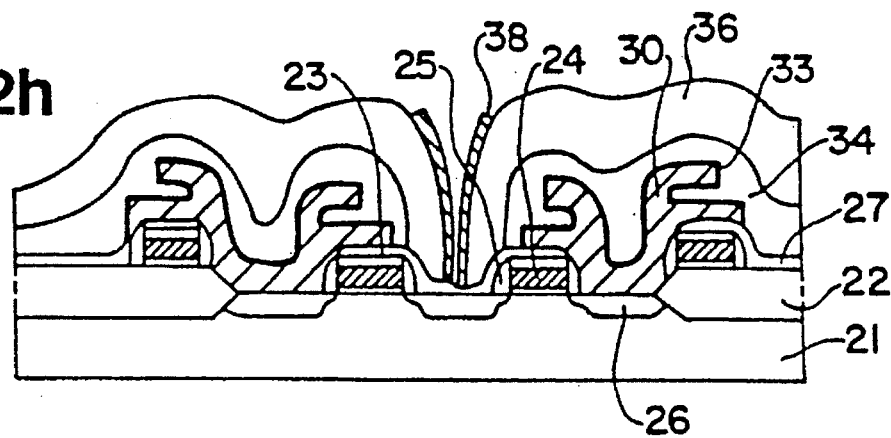
Figure 3A:
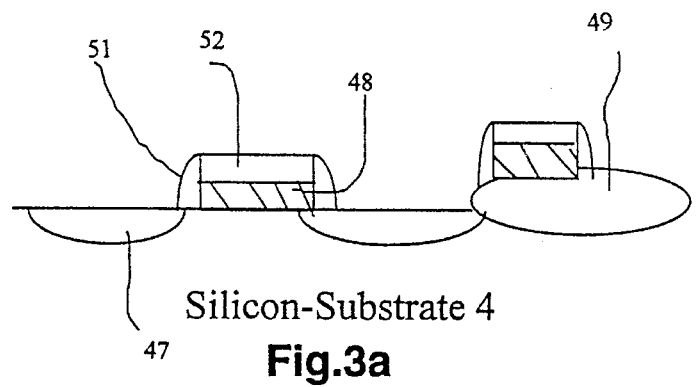
FIGS. 3a–3g show the processing steps of the present invention.
Figure 3B:
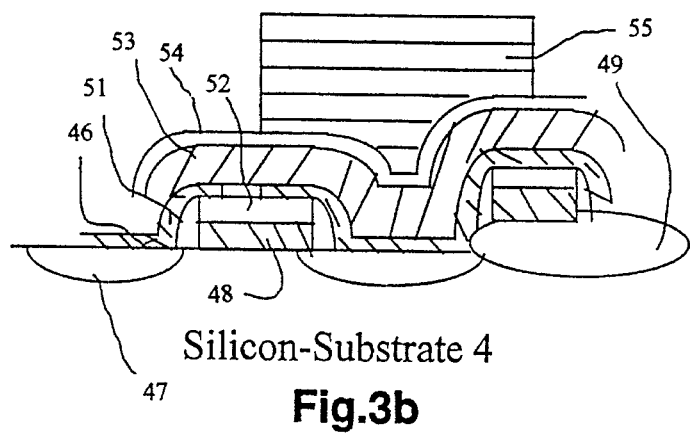
Figure 3C:
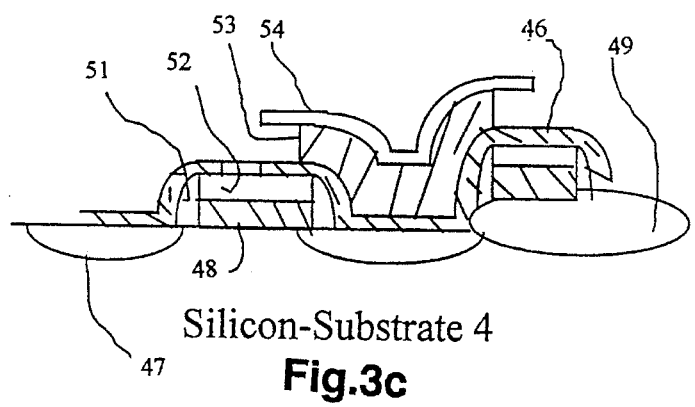
Figure 3D:
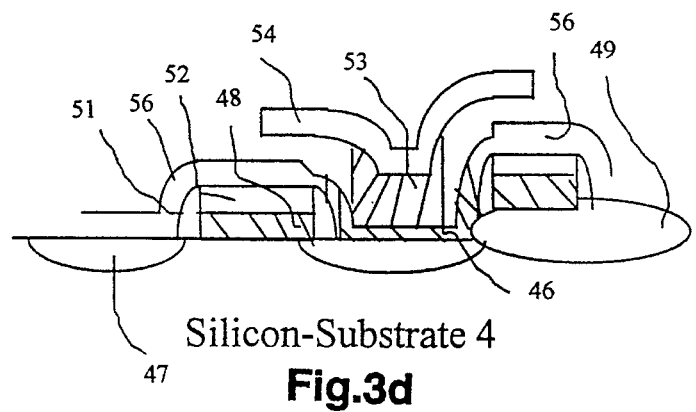
Figure 3E:
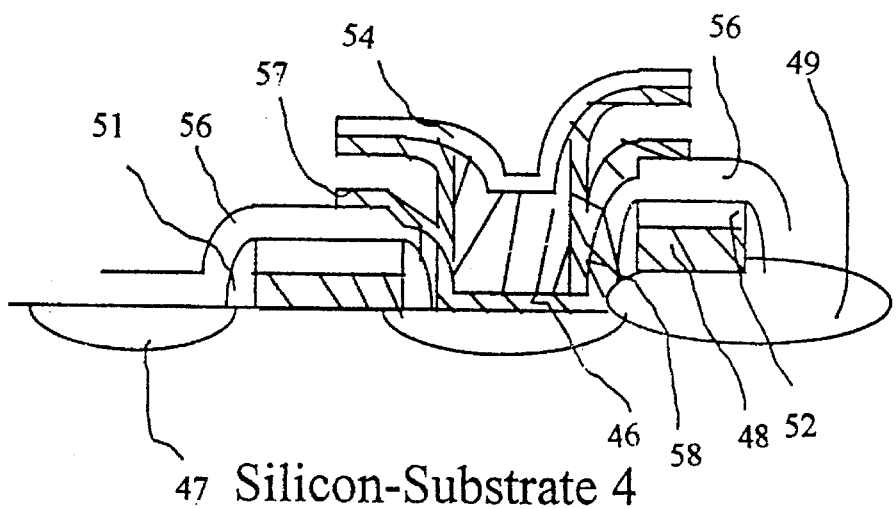
Figure 3F:
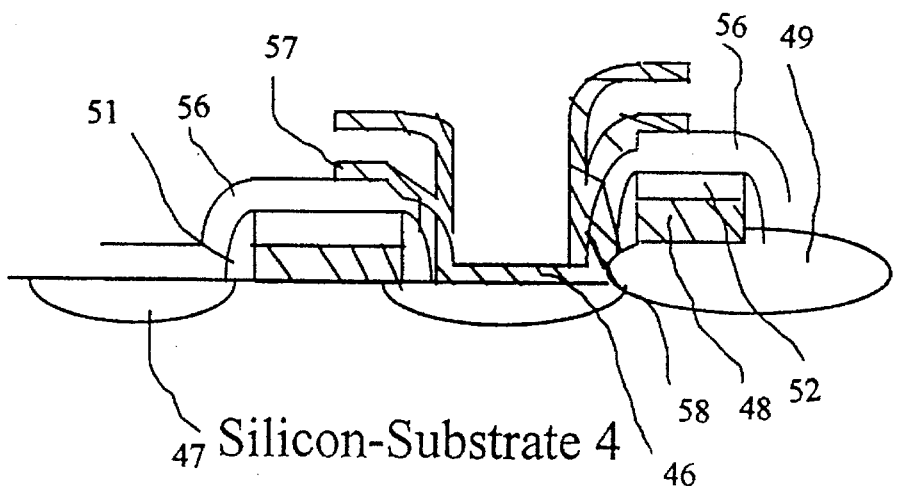
Figure 3G:
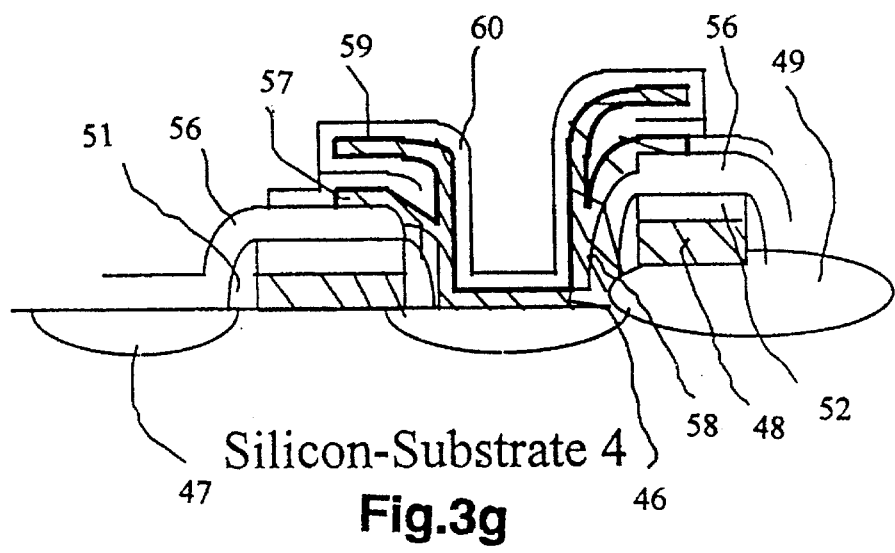

Referring now to FIG. 2h, on the overall exposed surface, dielectric layer 33 (denoted by a thick line in FIG. 2h) and polysilicon layer 34 are formed in turn. Dielectric layer 33 can be oxide, nitride-oxide (NO) or silicon-nitride-oxide (ONO). In the case of NO, such an NO layer can be formed by deposition of a thin nitride layer which is subsequently oxidized, all in a conventional manner. Thereafter, as shown in FIG. 2h, polysilicon layer 34 is removed partially at unnecessary regions to form plate nodes by photo and etching processes in a conventional manner. Subsequently, insulating layer 36 is deposited on the overall exposed surface such as by chemical vapor deposition. Insulating layer 36 is defined by photo and dry etching processes so as to form a bit line contact hole. Thereafter, a metal layer is deposited on the overall exposed surface and defined by photo and dry etching processes to form bit line 38, all in a conventional manner.

In the process from FIG. 2a to FIG. 2h, there are again four masking steps (FIGS. 2a, 2d, 2f and 2h), or three masking steps after source/drain diffusion.

In the present invention, the processing steps are shown from FIG. 3a to FIG. 3g.

Step A ( FIG. 3a): A field oxide layer [9] 49 is first grown on silicon substrate [4] 44 so that the silicon substrate is divided into active regions and field regions by the local oxidation of silicon process. Then the gate oxide (not shown) is grown, and deposited with a polysilicon layer [8] 48 and cap oxide layer [12] 52. The silicon wafer is subjected to photoetching processes so as to form a word line. Impurities are inplanted to form source and drain regions [7] 47 of a MOSFET. Spacer [11] 51 is formed by depositing and etching back silicon oxide.

Step B (FIG. 3b): A thin poly-silicon layer [6] 46, a silicon nitride SiN layer [13] 53 and a sacrificial oxide (sac) [14] 54 are deposited sequentially on the wafer. The polysilicon makes a contact to a diffusion of the MOSFET to form a buried contact. Apply photomasking process to pattern photoresist [15] 55 for the capacitor region, which overhangs the buried contact. This is the only mask used to form a node structure, compared with at least two masking steps in prior art. This node is referred to as "Self-Aligned Buried Node".

Step C (FIG. 3c): Sac oxide [14] 54 is etched by dry plasma etching process for better critical dimension control and the photoresist [15] 55 is stripped. Next, the SiN layer [13] 53 is dipped in phosphoric acid H3PO4 tank to remove some SiN. The SiN is undercut beneath the edges of sac oxide [14] 54, due to the isotrophic nature of wet etching. Thus, the sac oxide and the SiN overhang over the buried contact like an umbrella.

Step D (FIG. 3d): The buried polysilicon layer [6] 46 is oxidized with the undercut SiN [13] 53 as mask. It is known that oxidation rate of polysilicon is about three times faster than that of single-crystal silicon. Therefore, the treatment time at high temperature is greatly reduced. Oxide thickness is roughly twice that of buried polysilicon due to absorption of oxygen. The SiN [13] 53 is further undercut to expose a part of the buried polysilicon contact [6] 46. This exposed portion is for the buried polysilicon [6] 46 to contact the bottom or Node electrode of the capacitor.

step E (FIG. 3e): Polysilicon [17] 57 is deposited to form the node electrode which makes contact [18] 58 with the buried polysilicon [6] 46. Thus, the bottom electrode and the node contact are self-aligned. Next, the polysilicon [17] 57 is etched back with sac oxide [14] 54 as a hard mack due to the high etch selectivity nature of polysilicon to oxide.

Step F (FIG. 3f): The sac oxide [14] 54 is removed by dipping in dilute hydorflouric acid (HF) or buffer oxide etcher (BOE) or dry plasma etching, and SiN [13] 53 is stripped away in P3HO4 acid tank. The wafer is subjected to an injection of impurities to improve the conductivity of poly-silicon [6, 17] 46, 57. Impurity doping of polysilicon [6,17] 46, 57 must be done after SiN [13] 53 removal, because there is no satisfactory etch selectivity of SiN to doped polysilicon in $H_3PO_4$ acid.

Step G (FIG. 3g): On the overall exposed surface, a thin dielectric layer [19] 59 (denoted by thick line) and polysilicon layer [20] 60 are formed in turn. The dielectric layer can be of oxide-nitride-oxide structure. Polysilicon layer is removed partially at unnecessary regions to form a plate electrode by photomasking and etching processes in a conventional manner.

The following table shows the comparison of this invention with prior art:

|  | U.S. Pat. No. 5,128,273 | U.S. Pat. No. 5,290,726 | This invention |
| --- | --- | --- | --- |
| Furnace process | 5 | 4 | 5 |
| Plasma dry etch | 7 | 2 | 2 |
| Wet etch | 1 | 4 | 4 |
| Total process steps | 13 | 10 | 11 |

It can be seen the present invention saves one masking step without sacrificing cycle time.

This invention has the following advantages:

1. Masking steps are reduced through self-aligned buried node technology.
2. Cell area is made smaller due to self-alignment between node contact and bottom electrode polysilicon.
3. Isolation between the word line and the bottom electrode is improved, because there is no node contact etch/overetch on top of word line.
4. There is no need in design rule to allow for misalignment error because of self-alignment.
5. Capacitance of DRAM cell is increased due to increase capacitance of the fin structure.

While the foregoing embodiment describes a p-type substrate with n-type source/drain diffusion. It is obvious that the method applies equally well to a complementary structure.

What is claimed is:

1. A method of fabricating a stacked fin structure storage capacitor for a DRAM cell, comprising the steps of:

growing a field oxide layer on a semiconductor substrate so that the substrate is divided into active regions and field oxide regions;

growing a gate oxide, sequentially depositing a first polysilicon layer and cap oxide layer over said substrate, and patterning said first polysilicon layer to form a gate of an MOSFET;

forming spacer by depositing a second oxide layer over said gate and etching back said second oxide layer;

depositing a second polysilicon layer over said substrate including said spacer to contact a node contact diffusion region of said MOSFET;

sequentially depositing a silicon nitride and a sacrificial oxide (sac) layer on said second polysilicon layer, patterning and etching said sac oxide layer and said silicon nitride layer to form a capacitor area overhanging said node contact diffusion region, said patterned silicon nitride layer which is undercut beneath edges of said patterned sac oxide layer and exposing portions of said second polisilicon layer;

oxidizing said exposed portions of said second polysilicon layer selectively by using said patterned silicon nitride as a mask;

removing portions of said patterned silicon nitride layer to expose unoxidized portions of said second polysilicon layer and forming an enlarged undercut beneath each edge of said patterned sac oxide layer;

depositing a third polysilicon layer on sidewalls of said patterned silicon nitride layer, said second polysilicon layer and said enlarged undercut to form a bottom electrode of said capacitor, said third polysilicon layer contacting said unoxidized portions of said second polysilicon layer;

etching back said third polysilicon layer to form a fin-shape bottom capacitor electrode;

removing said patterned sac oxide and said patterned silicon nitride by etching;

forming a capacitor dielectric over said fin-shape bottom capacitor electrode; and depositing and patterning a fourth polysilicon layer to form a top electrode of said capacitor.

2. A method of fabricating a stacked fin structure storage capacitor as described in claim 1, wherein said field oxide is grown by a local oxidation of silicon process.

3. A method of fabricating a stacked fin structure storage capacitor as described in claim 1, wherein the step of patterning said sac oxide is by dry plasma etching.

4. A method of fabricating a stacked fin structure storage capacitor as described in claim 1, wherein said step of forming said undercut is dipping said silicon nitride in phosphoric acid.

5. A method of fabricating a stacked fin structure storage capacitor as described in claim 1, wherein said bottom electrode and the second polysilicon layer contact to said node contact diffusion region of said MOSFET is self-aligned.

6. A method of fabricating a stacked fin structure storage capacitor as described in claim 1, wherein said step of removing said patterned sac oxide is by dipping into a dilute hydrofluoric acid.

7. A method of fabricating a stacked fin-structure storage capacitor as described in claim 1, wherein the step of removing said patterned sac oxide is by dipping into a buffer oxide etch.

8. A method of fabricating a stacked fin structure storage capacitor as described in claim 1, wherein the step of removing said patterned sac oxide layer is by dry plasma etching.

9. A method of fabricating a stacked fin structure storage capacitor as described in claim 1, further comprising the step of injecting impurities into said second polysilicon layer to improve conductivity.

10. A method of fabricating a stacked fin structure storage capacitor as described in claim 1, wherein said dielectric of said capacitor is oxide-nitride-oxide.

* * * * *